(12) United States Patent
Oki et al.

(10) Patent No.: US 10,683,212 B2
(45) Date of Patent: Jun. 16, 2020

(54) SPINEL PARTICLES, METHOD FOR PRODUCING SAME, AND COMPOSITION AND MOLDING INCLUDING SPINEL PARTICLES

(71) Applicant: DIC Corporation, Tokyo (JP)

(72) Inventors: Hironobu Oki, Chiba (JP); Jianjun Yuan, Chiba (JP); Hiroshi Kinoshita, Chiba (JP)

(73) Assignee: DIC CORPORATION, Tokyo (JP)

( * ) Notice: Subject to any disclaimer, the term of this patent is extended or adjusted under 35 U.S.C. 154(b) by 125 days.

(21) Appl. No.: 15/559,018

(22) PCT Filed: Mar. 17, 2016

(86) PCT No.: PCT/JP2016/058498
§ 371 (c)(1),
(2) Date: Sep. 15, 2017

(87) PCT Pub. No.: WO2016/148236
PCT Pub. Date: Sep. 22, 2016

(65) Prior Publication Data
US 2018/0079654 A1    Mar. 22, 2018

(30) Foreign Application Priority Data

Mar. 18, 2015 (JP) .................. 2015-054750

(51) Int. Cl.
*C08K 3/22* (2006.01)
*C01F 7/16* (2006.01)
(Continued)

(52) U.S. Cl.
CPC .............. *C01F 7/162* (2013.01); *C01F 7/16* (2013.01); *C01G 39/00* (2013.01); *C08K 3/08* (2013.01);
(Continued)

(58) Field of Classification Search
CPC ... C01F 7/162; C08K 3/18; C08K 2003/2217; C08K 2003/227; C08K 2003/2255
(Continued)

(56) References Cited

U.S. PATENT DOCUMENTS

| | | | |
|---|---|---|---|
| 3,320,036 A * | 5/1967 | Scruggs | C22C 32/00 148/423 |
| 3,493,430 A * | 2/1970 | Manasevit | H01L 21/00 117/102 |
| 2006/0029811 A1* | 2/2006 | Sugioka | C08L 61/28 428/413 |

FOREIGN PATENT DOCUMENTS

| | | |
|---|---|---|
| JP | 2001-48529 A | 2/2001 |
| JP | 2003-267777 A | 9/2003 |

(Continued)

OTHER PUBLICATIONS

International Search Report and Written Opinion dated May 24, 2016, issued in International Application No. PCT/JP2016/058498. (w/ partial English translation).

*Primary Examiner* — Jane L Stanley
(74) *Attorney, Agent, or Firm* — McDermott Will & Emery LLP

(57) ABSTRACT

Spinel has conventionally been used as mentioned above in applications, such as gems, catalyst carriers, adsorbents, photocatalysts, optical materials, and heat-resistant insulating materials, and is not expected to be used in an application of an inorganic filler having thermal conductive properties. Accordingly, an object of the present invention is to provide spinel particles having excellent thermal conductive properties. A spinel particle having spinel containing a magnesium atom, an aluminum atom, and an oxygen atom, and molybdenum being existed on the surface of and/or in (Continued)

the inside of the spinel, wherein the crystallite diameter of the spinel at the [311] plane is 100 nm or more.

8 Claims, 3 Drawing Sheets

(51) Int. Cl.
    *C30B 29/22*     (2006.01)
    *C01G 39/00*     (2006.01)
    *C08L 101/00*     (2006.01)
    *C08K 3/08*     (2006.01)
    *C09K 5/14*     (2006.01)

(52) U.S. Cl.
    CPC .............. *C08K 3/22* (2013.01); *C08L 101/00* (2013.01); *C09K 5/14* (2013.01); *C30B 29/22* (2013.01); *C01P 2002/32* (2013.01); *C01P 2002/60* (2013.01); *C01P 2004/61* (2013.01); *C01P 2004/62* (2013.01); *C01P 2006/32* (2013.01); *C08K 2003/2217* (2013.01); *C08K 2003/2227* (2013.01); *C08K 2201/001* (2013.01); *C08K 2201/003* (2013.01)

(58) Field of Classification Search
    USPC ........................................................... 252/74
    See application file for complete search history.

(56) References Cited

FOREIGN PATENT DOCUMENTS

| | | |
|---|---|---|
| JP | 2004-027177 A | 1/2004 |
| JP | 2007-070608 A | 3/2007 |
| WO | 2013/039103 A1 | 3/2013 |

\* cited by examiner

SPINEL PARTICLES, METHOD FOR PRODUCING SAME, AND COMPOSITION AND MOLDING INCLUDING SPINEL PARTICLES

CROSS-REFERENCE TO RELATED APPLICATIONS

This application is the U.S. National Phase of PCT/JP2016/058498 filed Mar. 17, 2016, which claims priority to Japanese Patent Application No. 2015-054750 filed Mar. 18, 2015. The subject matter of each is incorporated herein by reference in entirety.

TECHNICAL FIELD

The present invention relates to a spinel particle, a method for producing the same, and a composition and a molded article including the spinel particles.

BACKGROUND ART

Conventionally, electric devices have been required to be reduced in size and weight and improved in performance, and, in accordance with such a tendency, semiconductor devices are increased in the integration degree and capacity. Therefore, the amount of heat generated in members constituting the electric device is increased, and the electric device is desired to be improved in the radiator function.

As a method for improving the electric device in radiator function, for example, there can be mentioned a method of imparting thermal conductive properties to an insulating member, more specifically, a method of adding an inorganic filler to a resin constituting an insulating member has been known. Examples of inorganic fillers used in this method include alumina (aluminum oxide), boron nitride, aluminum nitride, magnesium oxide, and magnesium carbonate.

In recent years, electric devices are further reduced in size and weight and improved in performance, and inorganic fillers having high thermal conductivity are desired.

By the way, spinel is a mineral generally represented by a chemical composition: $MgAl_2O_4$, and is used as gems. Further, from the viewpoint of the porous structure and easy modification, spinel is used in applications, such as catalyst carriers, adsorbents, photocatalysts, optical materials, and heat-resistant insulating materials.

For example, PTL 1 has a description about an invention of a $MgAl_2O_4$ spinel powder having a specific surface area of 80 $m^2$/g or more. The spinel powder of this invention is characterized in that it has an average particle diameter of 3 to 20 μm. PTL 1 has a description that, by virtue of having a specific surface area of 80 $cm^2$/or more, the spinel powder described in PTL 1 is used mainly as an occlusion-reduction type catalyst carrier to achieve high catalytic activity. Further, there is a description that, by virtue of having an average particle diameter of 3 to 20 μm, the spinel powder is easy to apply, and, further, a coating layer that is unlikely to be peeled off and suffers no crack formation can be obtained.

PTL 1 has a description that the spinel powder described in PTL 1 is obtained by pulverizing a $MgAl_2O_4$ spinel powder which is obtained by synthesis and calcination using an aluminum salt prepared by dissolving aluminum hydroxide in an acid and a magnesium salt prepared by dissolving magnesium hydroxide in an acid. Specifically, there is a description of a so-called coprecipitation method in which a composite hydroxide precipitate is synthesized using aluminum hydroxide and magnesium hydroxide, and the precipitate is subjected to heat treatment and the resultant $MgAl_2O_4$ spinel powder is pulverized.

CITATION LIST

Patent Literature

PTL 1: JP-A-2001-48529

SUMMARY OF INVENTION

Technical Problem

Spinel has conventionally been used as mentioned above in applications, such as gems, catalyst carriers, adsorbents, photocatalysts, optical materials, and heat-resistant insulating materials, and is not expected to be used in an application as an inorganic filler having thermal conductive properties. The reason for this is that, from the viewpoint of the cost, conventionally, alumina has been generally used as an inorganic filler, and spinel known to be lower in thermal conductivity than alumina has not been expected to be used as a thermally conductive inorganic filler.

Accordingly, an object of the present invention is to provide spinel particles having excellent thermal conductive properties.

Solution to Problem

The present inventors have conducted extensive and intensive studies with a view toward solving the above-mentioned problems. As a result, it has been found that the problems can be solved by increasing the crystallite diameter of the spinel particle at a predetermined crystal plane, and therefore, the present invention has been completed.

Specifically, the invention is directed to a spinel particle which includes spinel containing a magnesium atom, an aluminum atom, and an oxygen atom, and molybdenum being existed on the surface of and/or in the inside of the spinel, wherein the crystallite diameter of the spinel at the [311] plane is 100 nm or more.

Advantageous Effects of Invention

By the invention, spinel particles having excellent thermal conductive properties are provided.

DESCRIPTION OF EMBODIMENTS

Figure 1:
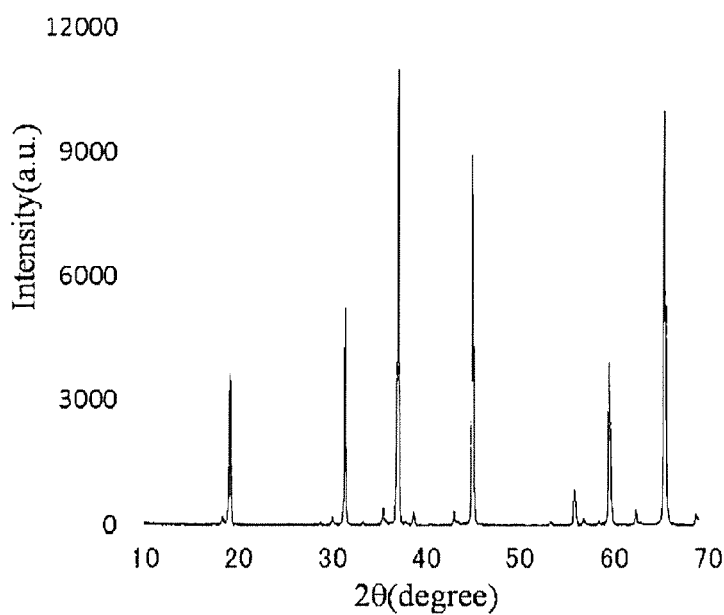
FIG. 1 is an X-ray diffraction pattern of the powder sample obtained in Example 1.

Hereinbelow, an embodiment for carrying out the present invention will be described in detail.
<Spinel Particles>

According to an embodiment of the invention, the spinel particle includes spinel containing a magnesium atom, an aluminum atom, and an oxygen atom, and molybdenum being existed on the surface of and/or in the inside of the spinel, wherein the crystallite diameter of the spinel at the [311] plane is 100 nm or more.

In the present specification, the "spinel particle" includes the whole of the particle including spinel and molybdenum. Further, the term "spinel" indicates the crystal per se. When molybdenum is existed on the surface of the spinel as mentioned below, the spinel crystal does not contain molybdenum as a constituent, and therefore the spinel particle and the spinel are different from each other. On the other hand, when molybdenum is existed in the inside of the spinel, the spinel crystal contains molybdenum as a constituent in the crystal lattice, which means that the spinel particle and the spinel are the same. When molybdenum is existed on the surface of the spinel and in the inside of the spinel, the spinel particle includes the spinel containing molybdenum as a constituent and molybdenum being existed on the surface of the spinel, and therefore the spinel particle and the spinel are different from each other.

The molybdenum is existed on the surface of and/or in the inside of the spinel. The expression "existed on the surface" of the spinel means that molybdenum is present on the surface of the spinel in the state of adhering, coating, or bonding onto the surface or in another state like that. Meanwhile, the expression "existed in the inside of" the spinel means that molybdenum is incorporated into the spinel and/or molybdenum is present in the space of the spinel. The wording "molybdenum is incorporated into the spinel" means that at least part of the atoms constituting the spinel is replaced by molybdenum so that the molybdenum is included as a part of the spinel crystal. With respect to the atom in the spinel to be replaced by molybdenum, there is no particular limitation, and the atom to be replaced by molybdenum may be a magnesium atom, an aluminum atom, an oxygen atom, or other atoms. Further, the wording "molybdenum is present in the space of the spinel" means that molybdenum is existed in the space which can be present in the inside of the crystal of the spinel. The molybdenum present in the space of the spinel is existed in the inside of the crystal, and therefore is unlikely to be removed by, for example, washing, differing from the molybdenum existed on the surface of the spinel.

Examples of shapes of the spinel particles include a polyhedral shape, a spherical shape, an ellipsoidal shape, a cylindrical shape, a polygonal prism shape, a needle-like shape, a rod shape, a plate form, a disk form, a flake form, and a scale form. Of these, from the viewpoint of facilitating dispersion of the spinel particles in a resin, preferred are a polyhedral shape, a spherical shape, an ellipsoidal shape, and a plate form, and more preferred are a polyhedral shape and a spherical shape. In the present specification, the term "polyhedral shape" means generally a shape of hexahedron or polyhedron having more than six faces, preferably octahedron or polyhedron having more than eight faces, more preferably a decahedron to triacontahedron.

The average particle diameter of the spinel particles is preferably 0.1 to 1,000 μm, more preferably 0.2 to 100 μm, further preferably 0.3 to 80 μm, especially preferably 0.4 to 60 μm. When the average particle diameter of the spinel particles is 0.1 μm or more, the viscosity of a composition obtained by mixing the spinel particles with a resin is advantageously not increased excessively. On the other hand, the average particle diameter of the spinel particles is preferably 1,000 μm or less from the viewpoint of achieving a molded article having smooth surface and excellent mechanical properties wherein the molded article is obtained from a composition obtained by mixing the spinel particles with a resin. In the present specification, the term "average particle diameter" means a value determined from the particle diameters measured from an image obtained by a scanning electron microscope (SEM) with respect to 100 particles arbitrarily selected. The term "particle diameter" means the largest length of the distances between two points on the line of contour of the particle.

The specific surface area of the spinel particles is preferably 10 $m^2/g$ or less, more preferably 0.001 to 8 $m^2/g$, further preferably 0.01 to 5 $m^2/g$. When the specific surface area of the spinel particles is 10 $m^2/g$ or less, the particles have excellent smoothness of the surface such that the particles can be advantageously dispersed in a resin or the like. In the present specification, the term "specific surface area" means a BET specific surface area, and a value obtained by a nitrogen gas adsorption/desorption method is employed.

The thermal conductivity of the spinel particles is preferably 10 W/(m·K) or more, more preferably 20 W/(m·K) or more, further preferably 35 W/(m·K) or more. When the thermal conductivity of the spinel particles is 10 W/(m·K) or more, the resultant resin compound can advantageously achieve higher thermal conductive properties.

[Spinel]

In the invention, the spinel contains a magnesium atom, an aluminum atom, and an oxygen atom, and is generally represented by a composition: $MgAl_2O_4$. The spinel may further contain other atoms and the molybdenum described below.

The crystallite diameter of the spinel at the [311] plane is 100 nm or more, preferably 120 nm or more, more preferably 150 nm or more, further preferably 200 nm or more. The [311] plane is a major crystal domain of the spinel, and the size of the crystal domain of the [311] plane corresponds to the crystallite diameter at the [311] plane. A large crystallite diameter of the particles means that the particles have high denseness and are highly crystalline such that they have no disordered portion in which scattering of phonons occurs, and therefore such particles are considered to have high thermal conductive properties. The crystallite diameter of the spinel at the [311] plane can be controlled by appropriately selecting the conditions for the method for producing the spinel particles described below. In the present specification, with respect to the value of the "crystallite diameter at the [311] plane", a value determined using the Sherrer's equation from a half band width of a peak ascribed to the [311] plane (peak appearing around 2θ=36.9 degrees) as measured using X-ray diffractometry (XRD) is employed.

(Magnesium Atom)

With respect to the content of the magnesium atom in the spinel, there is no particular limitation, but, when the structural formula of the spinel is represented by $Mg_xAl_yO_z$, x is preferably in the range of from (y−1.2) to (y−0.8), more preferably in the range of from (y−1.1) to (y−0.9). In an embodiment, when a specific example of the y is 2, a specific example of the x is preferably 0.8 to 1.2, more preferably 0.9 to 1.1. In the present specification, with respect to the content of the magnesium atom in the spinel, a value measured by a fluorescent X-ray elemental analysis method (XRF) is employed.

(Aluminum Atom)

With respect to the content of the magnesium atom in the spinel, there is no particular limitation, but, when the structural formula of the spinel is represented by $Mg_xAl_yO_z$, y is preferably in the range of from (x+0.8) to (x+1.2), more preferably in the range of from (x+0.9) to (x+1.1). In an embodiment, when a specific example of the x is 1, a specific example of the y is preferably 1.8 to 2.2, more preferably 1.9 to 2.1. In the present specification, with respect to the content of the aluminum atom in the spinel, a value measured by a fluorescent X-ray elemental analysis method (XRF) is employed.

(Oxygen Atom)

With respect to the content of the oxygen atom in the spinel, there is no particular limitation, but, when the structural formula of the spinel is represented by $Mg_xAl_yO_z$, z is preferably in the range of from (x+y+0.8) to (x+y+1.2), more preferably in the range of from (x+y+0.9) to (x+y+1.1). In an embodiment, when specific examples of the x and y are 1 and 2, respectively, a specific example of the z is preferably 3.8 to 4.2, more preferably 3.9 to 4.1.

(Other Atoms)

Other atoms can be contained in the spinel in such an amount that the effects of the invention are not sacrificed. Specific examples of other atoms include zinc, cobalt, nickel, iron, manganese, titanium, zirconium, calcium, strontium, and yttrium. The other atoms may be individually contained, or two or more types of the other atoms may be contained in combination.

The content of the other atoms in the spinel is preferably 10 mol % or less, more preferably 5 mol % or less, further preferably 2 mol % or less.

<Molybdenum>

Molybdenum can be contained due to the following method for producing the spinel particles.

The molybdenum is existed on the surface of and/or in the inside of the spinel.

The molybdenum includes molybdenum contained in the molybdenum-containing compound described below.

With respect to the content of molybdenum in the spinel particles, there is no particular limitation. However, from the viewpoint of achieving high thermal conductivity of the spinel particles, the content of molybdenum in the spinel is preferably 20 mol % or less, more preferably 10 mol % or less, further preferably 5 mol % or less. In the present specification, with respect to the content of molybdenum in the spinel, a value measured by a fluorescent X-ray analyzer is employed.

<Method for Producing the Spinel Particles>

The method for producing the spinel particles includes a calcination step for calcining a first mixture containing magnesium molybdate and an aluminum compound, and a cooling step for cooling the calcined material obtained in the calcination step. If necessary, the method may further include a precursor preparation step for calcining a second mixture containing a molybdenum compound and a magnesium compound to prepare the magnesium molybdate.

In an embodiment, the method preferably includes the precursor preparation step, the calcination step, and the cooling step in this order.

[Precursor Preparation Step]

The precursor preparation step is a step of calcining a second mixture containing a molybdenum compound and a magnesium compound to prepare magnesium molybdate.

(Second Mixture)

The second mixture contains a molybdenum compound and a magnesium compound.

Molybdenum Compound

With respect to the molybdenum compound, there is no particular limitation, but examples of molybdenum compounds include metallic molybdenum, and molybdenum compounds, such as molybdenum oxide, molybdenum sulfide, sodium molybdate, potassium molybdate, calcium molybdate, ammonium molybdate, $H_3PMo_{12}O_{40}$, and $H_3SiMo_{12}O_{90}$. In this case, the molybdenum compounds include isomers thereof. For example, the molybdenum oxide may be molybdenum dioxide (IV)($MoO_2$) or molybdenum trioxide (VI)($MoO_3$). Of these, preferred are molybdenum trioxide, molybdenum dioxide, and ammonium molybdate, and more preferred is molybdenum trioxide.

The above-mentioned molybdenum compounds may be used individually or in combination.

The molar ratio of a molybdenum element in the molybdenum compound to a magnesium element in the magnesium compound (molybdenum element/magnesium element) is preferably 0.01 to 10, more preferably 0.1 to 6. When the molar ratio is 0.01 or more, crystal growth can advantageously proceed. On the other hand, when the molar ratio is 10 or less, the formation of alumina having high degree of α-alumina structure, which is a by-product, in the calcination step described below can be advantageously suppressed or prevented.

Magnesium Compound

With respect to the magnesium compound, there is no particular limitation, but examples of magnesium compounds include metallic magnesium; magnesium derivatives, such as magnesium oxide, magnesium hydroxide, magnesium peroxide, magnesium fluoride, magnesium chloride, magnesium bromide, magnesium iodide, magnesium hydride, magnesium diboride, magnesium nitride, and magnesium sulfide; magnesium oxo-acid salts, such as magnesium carbonate, calcium magnesium carbonate, magnesium nitrate, magnesium sulfate, magnesium sulfite, magnesium perchlorate, trimagnesium phosphate, magnesium permanganate, and magnesium phosphate; magnesium organic salts, such as magnesium acetate, magnesium citrate, magnesium malate, magnesium glutamate, magnesium benzoate, magnesium stearate, magnesium acrylate, magnesium methacrylate, magnesium gluconate, magnesium naphthenate, magnesium salicylate, magnesium lactate, and magnesium monoperoxyphthalate; aluminum-magnesium-containing compounds, such as spinel, a spinel precursor (which has low crystalline properties but has the composition of spinel, and generally has a hydroxyl group), magnesium aluminate, hydrotalcite, and magnesium aluminum isopropoxide; and hydrates thereof. Of these, preferred are magnesium oxide, magnesium hydroxide, a spinel precursor, magnesium carbonate, magnesium acetate, magnesium nitrate, and magnesium sulfate, and more preferred are magnesium oxide, magnesium hydroxide, a spinel precursor, and magnesium acetate.

The above-mentioned magnesium compounds may be used individually or in combination.

With respect to the magnesium compound, one which is commercially available may be used, or one which is prepared may be used.

(Calcination)

Magnesium molybdate can be obtained by calcining a magnesium compound and a molybdenum compound.

With respect to the calcination temperature, there is no particular limitation as long as magnesium molybdate can be obtained, but the calcination temperature is preferably 200 to 2,000° C., more preferably 300 to 1,500° C., further preferably 400 to 1,000° C. When the calcination temperature is 200° C. or higher, a molybdenum compound and a magnesium compound can be advantageously reacted with each other efficiently. On the other hand, when the calcination temperature is 2,000° C. or lower, the calcination is advantageously easily performed industrially.

With respect to the calcination time, there is no particular limitation, but the calcination time is preferably 0.1 to 100 hours, more preferably 1 to 20 hours.

After the calcination, the resultant magnesium molybdate may be cooled and then isolated, or may be used as such in the calcination step described below.

(Magnesium Molybdate)

The magnesium molybdate has a function of a source generating molybdenum vapor in the calcination step described below and providing a magnesium atom which forms a crystal, together with an aluminum atom in the aluminum compound.

The magnesium molybdate contains a magnesium atom, a molybdenum atom, and an oxygen atom, and is generally represented by $MgMoO_4$.

The magnesium molybdate may have another composition. For example, when the above-described molar ratio of a molybdenum element to a magnesium element is other than 1:1, an excess unreacted magnesium compound or molybdenum compound may be present after the calcination. In this case, a mixture of magnesium molybdate and a magnesium compound, or a mixture of a molybdenum compound and a magnesium compound can be formed.

The magnesium molybdate may contain other atoms.

[Calcination Step]

The calcination step is a step of calcining a first mixture containing magnesium molybdate and an aluminum compound.

A defect structure or the like is likely to be caused in the spinel having a plurality of metal components upon being calcined, and therefore it is difficult to precisely control the crystal structure of such spinel. However, when magnesium molybdate and an aluminum compound are calcined, the spinel crystal structure containing magnesium, aluminum, and oxygen can be precisely controlled while molybdenum oxide functions as a fluxing agent, so that the crystallite diameter at the plane is increased, making it possible to produce spinel particles having excellent thermal conductive properties.

Conventionally, a synthesis of spinel particles is generally conducted by calcination at a high temperature, and, taking the particle growth into consideration, it has been difficult to obtain spinel particles having high thermal conductivity and having an average particle diameter of 1,000 μm or less, particularly 100 μm or less. For this reason, in a conventional method, there is a need to synthesize large spinel particles and then pulverize the large particles into a powdery form. In contrast, in the method according to the present embodiment, by using magnesium molybdate, spinel particles having high thermal conductivity and having an average particle diameter of 1,000 μm or less, particularly 100 μm or less can be produced.

The crystallite diameter of the spinel particles can be controlled mainly by appropriately selecting the amount of the added molybdenum which is a fluxing agent, specifically, the above-mentioned molar ratio of a molybdenum element to a magnesium element (molybdenum element/magnesium element). For example, as the molar ratio of a molybdenum element to a magnesium element (molybdenum element/magnesium element) is increased, the obtained spinel particles tend to be increased in the crystallite diameter. The reason for this is that magnesium molybdate and an aluminum compound undergo a reaction and/or form a solid solution, so that crystallization of spinel proceeds. More specifically, magnesium molybdate and an aluminum compound undergo a reaction and/or form a solid solution, so that molybdenum oxide is first formed and the molybdenum oxide functions as a flux in crystallization of spinel containing a magnesium atom, an aluminum atom, and an oxygen atom. In this instance, by increasing the amount of the flux, spinel particles having a large crystallite diameter at the [311] plane can be obtained.

Further, the average particle diameter of the spinel particles can be controlled mainly by appropriately selecting the amount of the added molybdenum which is a flux, specifically, the above-mentioned molar ratio of a molybdenum element to a magnesium element (molybdenum element/magnesium element). The reason for this is the same as that for the above-mentioned control of the crystallite diameter, and molybdenum functions as a flux, and, by increasing the amount of the flux used, spinel particles having a large average particle diameter can be obtained.

(First Mixture)

The first mixture contains magnesium molybdate and an aluminum compound.

Magnesium Molybdate

With respect to the magnesium molybdate, one which is prepared by the above-mentioned precursor preparation step may be used, or one which is commercially available may be used.

Aluminum Compound

With respect to the aluminum compound, there is no particular limitation, but examples of aluminum compounds include metallic aluminum; aluminum derivatives, such as alumina (aluminum oxide), aluminum hydroxide, aluminum sulfide, aluminum nitride, aluminum fluoride, aluminum chloride, aluminum bromide, and aluminum iodide; aluminum oxo-acid salts, such as aluminum sulfate, sodium aluminum sulfate, potassium aluminum sulfate, ammonium aluminum sulfate, aluminum nitrate, aluminum perchlorate, aluminum aluminate, aluminum silicate, and aluminum phosphate; aluminum organic salts, such as aluminum acetate, aluminum lactate, aluminum laurate, aluminum stearate, and aluminum oxalate; aluminum alkoxides, such as aluminum propoxide and aluminum butoxide; aluminum-magnesium-containing compounds, such as spinel, a spinel precursor, magnesium aluminate, hydrotalcite, and magnesium aluminum isopropoxide; and hydrates thereof. Of these, aluminum oxide, aluminum hydroxide, aluminum chloride, aluminum sulfate, aluminum nitrate, or a hydrate thereof is preferably used, and aluminum oxide, aluminum hydroxide, or a spinel precursor is more preferably used.

The above-mentioned aluminum compounds may be used individually or in combination.

The molar ratio of a magnesium element in the magnesium molybdate to an aluminum element in the aluminum compound (aluminum element/magnesium element) is preferably in the range of from 2.2 to 1.8, more preferably in the range of from 2.1 to 1.9. When the molar ratio is in the range of from 2.2 to 1.8, spinel particles having a large crystallite diameter at the [311] plane and having high thermal conductivity can be advantageously synthesized.

(Calcination)

Spinel particles can be obtained by calcining magnesium molybdate and an aluminum compound.

In the invention, calcination causes magnesium molybdate and an aluminum compound to undergo a reaction and/or form a solid solution, so that molybdenum oxide is formed and the molybdenum oxide functions as a flux in crystallization of spinel containing a magnesium atom, an aluminum atom, and an oxygen atom, forming spinel particles. After the spinel particles are formed, almost all the molybdenum compound has suffered sublimation in the form of molybdenum oxide, but the molybdenum which has not suffered sublimation can be existed on the surface of and/or in the inside of the formed spinel. The content of molybdenum in the spinel particles is likely to depend on the calcination temperature/calcination time. For example, when the calcination is performed at a high temperature and/or for a long time, the molybdenum content of the spinel particles tends to decrease.

With respect to the calcination temperature, there is no particular limitation as long as desired spinel particles can be obtained, but the calcination temperature is preferably 800 to 2,000° C., more preferably 1,200 to 1,600° C. When the calcination temperature is 800° C. or higher, spinel particles having a large crystallite diameter at the [311] plane can be advantageously obtained in a short time. On the other hand, when the calcination temperature is 2,000° C. or lower, the particle diameter of the spinel is advantageously easily controlled.

With respect to the calcination time, there is no particular limitation, but the calcination time is preferably 0.1 to 1,000 hours, more preferably 3 to 100 hours. When the calcination time is 0.1 hour or more, spinel particles having a large crystallite diameter at the [311] plane can be advantageously obtained. On the other hand, when the calcination time is 1,000 hours or less, the production cost can be advantageously reduced.

The calcination atmosphere may be an air atmosphere, an atmosphere of an inert gas, such as nitrogen gas or argon gas, an oxygen atmosphere, an ammonia gas atmosphere, or a carbon dioxide atmosphere. In this case, from the viewpoint of the production cost, an air atmosphere is preferred. When surface modification or the like of the spinel particles is performed simultaneously with the calcination, an ammonia gas atmosphere is preferred.

With respect to the pressure for the calcination, there is no particular limitation, and the calcination may be conducted under atmospheric pressure, under a pressure, or under a reduced pressure, but, from the viewpoint of the production cost, the calcination is preferably conducted under atmospheric pressure.

With respect to the heating means, there is no particular limitation, but a calcination furnace is preferably used. Examples of usable calcination furnaces include a tunnel kiln, a roller hearth kiln, a rotary kiln, and a muffle furnace.

[Precursor Preparation-Calcination Step]

In an embodiment of the invention, preparation of magnesium molybdate and the calcination step using the magnesium molybdate can be simultaneously performed.

Specifically, the precursor preparation-calcination step is a step of calcining a third mixture containing a magnesium compound, a molybdenum compound, and an aluminum compound to produce spinel particles.

When the third mixture is calcined, a magnesium compound and a molybdenum compound are first reacted to synthesize magnesium molybdate. Then, the obtained magnesium molybdate is reacted with an aluminum compound present in the same system to produce spinel particles.

By virtue of the precursor preparation-calcination step, a step in which magnesium molybdate is separately prepared and, if necessary, purified, and then an aluminum compound is added to the magnesium molybdate can be advantageously omitted.

When the third mixture is calcined, molybdenum and an aluminum compound may be reacted to produce aluminum molybdate. However, by employing a calcination temperature of preferably 800° C. or higher, more preferably 950° C. or higher, aluminum molybdate is converted to magnesium molybdate which is more stable at a high temperature, making it possible to obtain desired spinel particles.

When an aluminum-magnesium-containing compound which is both a magnesium compound and an aluminum compound is used, the third mixture contains an aluminum-magnesium-containing compound and a molybdenum compound. When the aluminum-magnesium-containing compound is used, high stability at high temperatures of magnesium molybdate causes an environment in which magnesium molybdate and aluminum coexist as mentioned above, so that desired spinel can be obtained. For example, when spinel is used as an aluminum-magnesium-containing compound, the compound having the structure of spinel is subjected to the precursor preparation-calcination step and changed to magnesium molybdate in a high-temperature environment, and then further undergoes crystallization to be spinel, making it possible to obtain desired spinel.

[Mixing State During Calcination]

In the calcination step or precursor preparation-calcination step, it is preferred that mixing upon synthesizing spinel is made so that an aluminum element and a magnesium element as a source of spinel have high reactivity.

Specific examples of mixing states include physical mixing, impregnation, and coprecipitation.

The physical mixing indicates simple mixing of two types of raw materials, that is, a compound containing a magnesium element (magnesium molybdate or a magnesium compound) and a compound containing an aluminum element (aluminum compound).

The impregnation indicates impregnation with two types of raw materials. As a result of the impregnation, a compound containing a magnesium element is supported on a compound containing an aluminum element, or a compound containing an aluminum element is supported on a compound containing a magnesium element.

Further, the coprecipitation indicates coprecipitation of two types of raw materials. As a result of the coprecipitation, a compound containing a magnesium element and a compound containing an aluminum element constitute a single compound (spinel precursor).

Of these, from the viewpoint of the high reactivity, preferred are impregnation (state of a compound having another one supported thereon) and coprecipitation (state in which a compound containing a magnesium element and a compound containing an aluminum element are present in a single compound), and more preferred is coprecipitation (state in which a compound containing a magnesium element and a compound containing an aluminum element are present in a single compound). Crystal growth is likely to occur by calcining in close of atoms.

[Cooling Step]

The cooling step is a step of cooling spinel particles which have crystal-grown in the calcination step so that the spinel is crystallized to be in a particulate form.

With respect to the cooling rate, there is no particular limitation, but the cooling rate is preferably 1 to 1,000° C./hour, more preferably 5 to 500° C./hour, further preferably 50 to 100° C./hour. When the cooling rate is 1° C./hour or more, the production time can be advantageously reduced. On the other hand, when the cooling rate is 1,000° C./hour or less, the container for calcination is unlikely to be broken due to thermal shock and can be advantageously used for a long term.

With respect to the cooing method, there is no particular limitation, and natural cooling may be performed, or a cooing apparatus may be used.

<Composition>

In an embodiment of the invention, there is provided a composition including the spinel particles and a resin. If necessary, the composition may further include a curing agent, a curing accelerator, a curing catalyst, a viscosity modifier, a plasticizer, or the like.

(Spinel Particles)

With respect to the spinel particles, those described above can be used and therefore description of them is omitted.

The spinel particles which have been subjected to surface treatment can be used.

A single type of the spinel particles may be used individually, or two or more types of the spinel particles may be used in combination.

The spinel particles and another filler may be used in combination.

The content of the spinel particles in the composition is preferably 10 to 95% by mass, more preferably 30 to 90% by mass, based on the mass of the composition. When the content of the spinel particles is 10% by mass or more, the spinel particles can advantageously efficiently exhibit high thermal conductivity. On the other hand, when the content of the spinel particles is 95% by mass or less, a resin composition having excellent moldability can be advantageously obtained.

(Resin)

With respect to the resin, there is no particular limitation, and examples of resins include thermoplastic resins and thermosetting resins.

With respect to the thermoplastic resin, there is no particular limitation, and there can be used a resin which is known and commonly used in molding materials and the like. Specific examples of thermoplastic resins include polyethylene resins, polypropylene resins, polymethyl methacrylate resins, polyvinyl acetate resins, ethylene-propylene copolymers, ethylene-vinyl acetate copolymers, polyvinyl chloride resins, polystyrene resins, polyacrylonitrile resins, polyamide resins, polycarbonate resins, polyacetal resins, polyethylene terephthalate resins, polyphenylene oxide resins, polyphenylene sulfide resins, polysulfone resins, polyether sulfone resins, polyether ether ketone resins, polyallyl sulfone resins, thermoplastic polyimide resins, thermoplastic urethane resins, polyaminobismaleimide resins, polyamide-imide resins, polyether imide resins, bismaleimide triazine resins, polymethylpentene resins, fluorinated resins, liquid crystal polymers, olefin-vinyl alcohol copolymers, ionomer resins, polyarylate resins, acrylonitrile-ethylene-styrene copolymers, acrylonitrile-butadiene-styrene copolymers, and acrylonitrile-styrene copolymers.

The thermosetting resin is a resin having properties such that it can be changed to be substantially insoluble or infusible upon being cured by a method, such as heating, radiation, or a catalyst, and, generally, there can be used a resin which is known and commonly used in molding materials and the like. Specific examples of thermosetting resins include novolak phenolic resins, such as a phenolic novolak resin and a cresol novolak resin; phenolic resins, such as resol phenolic resins, e.g., an unmodified resol phenolic resin and an oil-modified resol phenolic resin modified with tung oil, linseed oil, walnut oil, or the like; bisphenol epoxy resins, such as a bisphenol A epoxy resin and a bisphenol F epoxy resin; novolak epoxy resins, such as an aliphatic chain-modified bisphenol epoxy resin, a novolak epoxy resin, and a cresol novolak epoxy resin; epoxy resins, such as a biphenyl epoxy resin and a polyalkylene glycol epoxy resin; resins having a triazine ring, such as an urea resin and a melamine resin; vinyl resins, such as (a)an (meth)acrylic resin and a vinyl ester resin; unsaturated polyester resins, bismaleimide resins, polyurethane resins, diallyl phthalate resins, silicone resins, resins having a benzoxazine ring, and cyanate ester resins.

The above-mentioned resins may be used individually or in combination. In this case, two or more types of thermoplastic resins may be used, two or more types of thermosetting resins may be used, or one or more types of thermoplastic resins and one or more types of thermosetting resins may be used.

The content of the resin in the composition is preferably 5 to 90% by mass, more preferably 10 to 70% by mass, based on the mass of the composition. When the resin content is 5% by mass or more, excellent moldability can be advantageously imparted to the resin composition. On the other hand, when the resin content is 90% by mass or less, a molded compound having high thermal conductivity can be advantageously obtained.

(Curing Agent)

With respect to the curing agent, there is no particular limitation, and a known curing agent can be used.

Specific examples of curing agents include amine compounds, amide compounds, acid anhydride compounds, and phenolic compounds.

Examples of the amine compounds include diaminodiphenylmethane, d ethylenetriamine, triethylenetetramine, diaminodiphenyl sulfone, isophorone diamine, imidazole, a $BF_3$-amine complex, and guanidine derivatives.

Examples of the amide compounds include dicyandiamide, and a polyamide resin synthesized from a dimer of linolenic acid and ethylenediamine.

Examples of acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride.

Examples of phenolic compounds include polyhydric phenolic novolak resins synthesized from a polyhydric hydroxy compound and formaldehyde, such as a phenolic novolak resin, a cresol novolak resin, an aromatic hydrocarbon formaldehyde resin-modified phenolic resin, a dicyclopentadiene phenol addition-type resin, a phenolic aralkyl resin (Xylok resin), and a resorcin novolak resin, and polyhydric phenolic compounds, such as a naphtholaralkyl resin, a trimethylolmethane resin, a tetraphenylolethane resin, a naphthol novolak resin, a naphthol-phenol cocondensed novolak resin, a naphthol-cresol cocondensed novolak resin, a biphenyl-modified phenolic resin (a polyhydric phenolic compound having a phenol nucleus connected through a bismethylene group), a biphenyl-modified naphthol resin (a polyhydric naphthol compound having a phenol nucleus connected through a bismethylene group), an aminotriazine-modified phenolic resin (a polyhydric phenolic compound having a phenol nucleus connected through melamine, benzoguanamine, or the like), and an alkoxy group-containing aromatic ring-modified novolak resin (a polyhydric phenolic compound having a phenol nucleus and an alkoxy group-containing aromatic ring connected through formaldehyde).

The above-mentioned curing agents may be used individually or in combination.

(Curing Accelerator)

The curing accelerator has a function of accelerating curing of the composition being cured.

With respect to the curing accelerator, there is no particular limitation, but examples of curing accelerators include phosphorus compounds, tertiary amines, imidazoles, organic acid metal salts, Lewis acids, and amine complex salts.

The above-mentioned curing accelerators may be used individually or in combination.

(Curing Catalyst)

The curing catalyst has a function of causing a compound having an epoxy group to undergo a curing reaction as a substitute for the curing agent.

With respect to the curing catalyst, there is no particular limitation, and there can be used a heat polymerization initiator or active energy ray polymerization initiator which is known and commonly used.

The curing catalysts may be used individually or in combination.

(Viscosity Modifier)

The viscosity modifier has a function of modifying the viscosity of the composition.

With respect to the viscosity modifier, there is no particular limitation, and an organic polymer, polymer particles, inorganic particles, or the like can be used.

The viscosity modifiers may be used individually or in combination.

(Plasticizer)

The plasticizer has a function of improving a thermoplastic synthetic resin in processability, flexibility, or weathering resistance.

With respect to the plasticizer, there is no particular limitation, and a phthalate, an adipate, a phosphate, a trimellitate, a polyester, a polyolefin, a polysiloxane, or the like can be used.

The above-mentioned plasticizers may be used individually or in combination.

(Applications)

According to an embodiment of the invention, the composition of the present embodiment is used in a thermally conductive material.

As mentioned above, alumina has been generally used as a thermally conductive material from the viewpoint of the cost, and further boron nitride, aluminum nitride, magnesium oxide, magnesium carbonate, and the like have been used. In this connection, spinel particles have been known to be poorer in thermal conductive properties than alumina, and therefore there has not been an idea that spinel particles are used instead of alumina.

In contrast, the spinel particles of the present embodiment have a large crystallite diameter at the [311] plane and hence have excellent thermal conductive properties. Particularly, the thermal conductivity of the spinel particles is higher than the thermal conductivity of alumina. Therefore, the composition of the present embodiment is preferably used in a thermally conductive material.

In an embodiment, the spinel particles obtained by the above-described method have a particle diameter on the order of micron (1,000 µm or less) and a large crystallite diameter, and therefore have excellent dispersibility in a resin, and hence can exhibit more excellent thermal conductive properties in the form of a composition.

Further, in another embodiment, the spinel particles obtained by the above-described method are particles of a polyhedral shape having a specific crystal plane synthesized by a flux method, and are not obtained by pulverizing particles of an indefinite shape, and hence the spinel particles have excellent smoothness and excellent dispersibility in a resin. Therefore, the spinel particles can exhibit very high thermal conductive properties in the form of a composition.

In addition, the spinel particles can be used in applications, such as gems, catalyst carriers, adsorbents, photocatalysts, optical materials, heat-resistant insulating materials, substrates, and sensors.

<Molded Article>

In an embodiment of the invention, there is provided a molded article which is obtained by molding the above-described composition.

The spinel particles contained in the molded article have excellent thermal conductive properties, and therefore the molded article is preferably used as an insulating radiator member. Thus, the molded article can improve electric devices in the radiator function, and can contribute to the reduction in size and weight and the improvement of performance of the electric devices.

Further, the molded article according to another embodiment of the invention can be used in low-permittivity members and the like. The spinel particles in the molded article have a low permittivity, and therefore can contribute to the improvement of communication function in high-frequency circuits.

EXAMPLES

Hereinbelow, the present invention will be described in more detail with reference to the following Examples, which should not be construed as limiting the scope of the invention.

Example 1

(Production of Spinel Particles)

6.9 g of magnesium acetate tetrahydrate (manufactured by Wako Pure Chemical Industries, Ltd.) was dissolved in 62.4 g of pure water to prepare an aqueous solution of magnesium acetate.

Then, 5 g of aluminum hydroxide (manufactured by Wako Pure Chemical Industries, Ltd.) which had been dried at 100° C. overnight was impregnated with the above-prepared aqueous solution of magnesium acetate, and then dried at 90° C. for 72 hours to obtain a spinel precursor (an aluminum compound having a magnesium compound supported thereon).

1.00 g of the spinel precursor (magnesium element: 3.3 mmol; aluminum element: 6.6 mmol) and 0.48 g of molybdenum trioxide (manufactured by Wako Pure Chemical Industries, Ltd.) (molybdenum element: 3.3 mmol) were added to an alumina crucible, and the temperature of the resultant mixture was increased in an air atmosphere at a temperature increase rate of 10° C./minute to 1,200° C. Then, the mixture was heated at 1,200° C. for 12 hours, and allowed to stand to be naturally cooled to room temperature, thereby obtaining a powder sample.

The obtained sample was washed with 10% aqueous ammonia, and then washed with water to remove magnesium molybdate remaining on the surface of the spinel particles, thereby producing spinel particles.

(Evaluation)

With respect to the powder sample and the produced spinel particles, the following evaluation was conducted.

<Analysis of the Crystal Structure>

With respect to the powder sample, the crystal structure was analyzed by X-ray diffractometry (XRD).

Specifically, using Rint-TT II (manufactured by Rigaku Corporation) which is a wide-angle X-ray diffraction apparatus, an analysis was conducted. In this instance, a 2θ/θ method was used as a measurement method. Measuring conditions are such that the scanning speed is 2.0 degrees/minute, the scanning range is 5 to 70 degrees, and the step is 0.02 degree.

As a result, the powder sample was found to be a spinel crystal of a cubic crystal system having a composition: $MgAl_2O_4$ and highly crystalline properties.

The measured X-ray diffraction pattern is shown in FIG. 1.

<Measurement of the Surface State>

With respect to the powder sample, the surface state was measured by Raman spectroscopy.

Specifically, using LabRAM HR-800 (manufactured by Horiba, Ltd.) which is a microscopic Raman spectrometer, measurement was made. Measuring conditions are such that an excited laser of 633 nm (HeNe) is used, the magnification of an objective lens is 100 times, a diffraction grating of 600 gr/mm is used, and the wavenumber range is 1,000 to 100 $cm^{-1}$, and wavelength calibration was made by adjusting a peak ascribed to a silicon crystal to $520\pm1$ $cm^{-1}$ before measurement of the sample.

As a result, a peak ascribed to magnesium molybdate contained in the spinel particles was observed.

Figure 2:
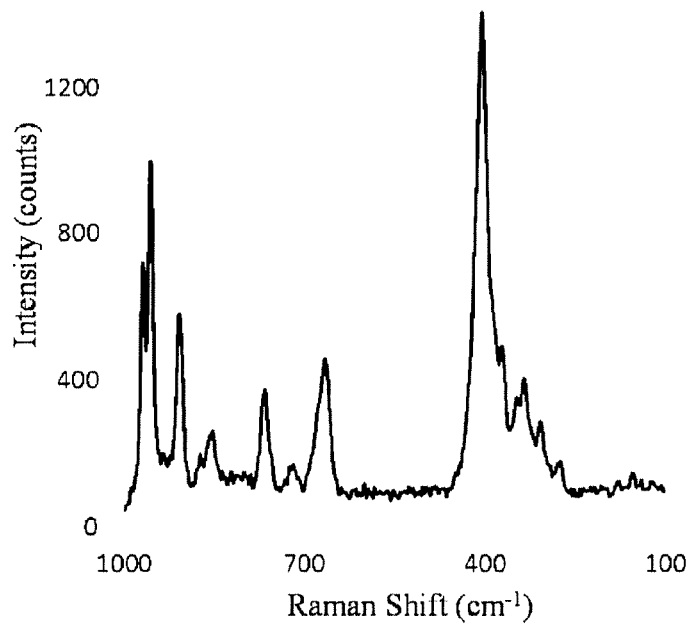
FIG. 2 is a Raman spectrum of the powder sample obtained in Example 1.

The measured Raman spectrum is shown in FIG. 2.

<Measurement of an Average Particle Diameter>

With respect to the produced spinel particles, an average particle diameter was measured by examination under a scanning electron microscope (SEM).

Specifically, using VE-9800 (manufactured by Keyence Corporation) which is a surface examination apparatus, an average particle diameter was measured.

As a result, the average particle diameter was found to be 10 μm.

Figure 3:
FIG. 3 is a SEM image of the spinel particles produced in Example 1.

A SEM image of the obtained spinel particles is shown in FIG. 3.

<Measurement of a Molybdenum Content>

With respect to the produced spinel particles, a molybdenum content was measured by X-ray Fluorescence Analysis (XRF).

Specifically, measurement was made using ZSX100e (manufactured by Rigaku Corporation) which is a fluorescent X-ray analyzer. In this instance, an FP (function point) method was used as a measurement method. Measuring conditions are such that EZ scanning is used, the measuring range is B to U, the measured diameter is 10 mm, and the sample weight is 50 mg. The measurement was performed with respect to a sample as in the form of a powder, and, in this instance, a polypropylene (PP) film was used for preventing the powder from scattering.

As a result, a molybdenum content of the spinel particles was found to be 0.45 mol %.

<Measurement of a Specific Surface Area>

With respect to the produced spinel particles, a BET specific surface area was measured.

Specifically, measurement was made using an apparatus Model Tris 3000 (manufactured by Micromeritics Instrument Company). In this instance, a nitrogen gas adsorption/desorption method was used as a measurement method.

As a result, the specific surface area of the spinel particles was found to be 0.2 $m^2/g$.

<Measurement of a Crystallite Diameter>

With respect to the produced spinel particles, a crystallite diameter at the [311] plane was measured.

Specifically, measurement was made using SmartLab (manufactured by Rigaku Corporation) which is an X-ray diffraction apparatus, using a high-intensity high-resolution crystal analyzer (CALSA) as a detector, and using PDXL as an analysis soft. In this instance, a 2θ/θ method was used as a measurement method, and an analysis was made by making a calculation using the Sherrer's equation from a half band width of a peak appearing around $2\theta=36.85°$. Measuring conditions are such that the scanning speed is 0.05 degree/minute, the scanning range is 5 to 70 degrees, the step is 0.002 degree, and the apparatus standard width is 0.027° (Si).

As a result, the crystallite diameter of the spinel particles at the [311] plane was found to be 353 nm.

Example 2

(Production of Spinel Particles)

1.00 g of aluminum oxide (manufactured by Wako Pure Chemical Industries, Ltd.) (aluminum element: 19.6 mmol), 0.40 g of magnesium oxide (manufactured by Wako Pure Chemical Industries, Ltd.) (magnesium element: 9.8 mmol), and 1.42 g of molybdenum trioxide (manufactured by Wako Pure Chemical Industries, Ltd.) (molybdenum element: 9.8 mmol) were added to an alumina crucible, and the temperature of the resultant mixture was increased in an air atmosphere at a temperature increase rate of 10° C./minute to 1,500° C. Then, the mixture was heated at 1,500° C. for 12 hours, and allowed to stand to be naturally cooled to room temperature, thereby obtaining a powder sample.

The obtained sample was washed with 10% aqueous ammonia, and then washed with water to remove magnesium molybdate remaining on the surface of the spinel particles, producing spinel particles.

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 12 μm, the molybdenum content was 0.30 mol %, the specific surface area was 0.1 $m^2/g$, and the crystallite diameter at the [311] plane was 196 nm.

Example 3

(Production of Spinel Particles)

Spinel particles were produced by the same method as in Example 2 except that the amount of the molybdenum trioxide added was changed to 1.85 g (molybdenum element: 12.9 mmol).

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 25 μm, the molybdenum content was 0.30 mol %, the specific surface area was 0.1 $m^2/g$, and the crystallite diameter at the [311] plane was 176 nm.

Figure 4:
FIG. 4 is a SEM image of the spinel particles produced in Example 3.
Figure 5:
FIG. 5 is a SEM image of the spinel particles produced in Comparative Example 1.

A SEM image of the obtained spinel particles is shown in FIG. 4.

Example 4

(Production of Spinel Particles)

Spinel particles were produced by the same method as in Example 2 except that the amount of the molybdenum trioxide added was changed to 2.43 g (molybdenum element: 16.9 mmol).

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 100 μm, the molybdenum content was 0.30 mol %, the specific surface area was 0.1 m$^2$/g, and the crystallite diameter at the [311] plane was 330 nm or more.

Example 5

(Production of Spinel Particles)

Spinel particles were produced by substantially the same method as in Example 2 except that the amount of the molybdenum trioxide added was changed to 8.57 g (molybdenum element: 59.5 mmol).

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 500 μm, the molybdenum content was 0.30 mol %, the specific surface area was 0.1 m$^2$/g, and the crystallite diameter at the [311] plane was 330 nm or more.

Example 6

(Production of Spinel Particles)

Spinel particles were produced by the same method as in Example 2 except that, instead of 1.00 g of aluminum oxide (manufactured by Wako Pure Chemical Industries, Ltd.), 1.53 g of aluminum hydroxide (manufactured by Wako Pure Chemical Industries, Ltd.) (aluminum element: 9.8 mmol) was used.

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 10 μm, the molybdenum content was 0.15 mol %, the specific surface area was 0.1 m$^2$/g, and the crystallite diameter at the [311] plane was 273 nm.

Example 7

(Production of Spinel Particles)

1.41 g of magnesium acetate tetrahydrate (manufactured by Wako Pure Chemical Industries, Ltd.) and 4.95 g of aluminum nitrate nonahydrate (manufactured by Wako Pure Chemical Industries, Ltd.) were dissolved in 50 g of pure water to prepare an aqueous solution containing a magnesium compound and an aluminum compound.

Then, the above-prepared aqueous solution containing a magnesium compound and an aluminum compound was dropwise added to 100 g of 5% aqueous ammonia to obtain a white precipitate. The obtained precipitate was recovered by filtration by means of suction, and washed with water, and dried to obtain a spinel precursor (a hydroxide containing magnesium and aluminum).

0.74 g of the spinel precursor (magnesium element: 3.3 mmol; aluminum element: 6.6 mmol) and 0.48 g of molybdenum trioxide (manufactured by Wako Pure Chemical Industries, Ltd.) (molybdenum element: 3.3 mmol) were added to an alumina crucible, and the temperature of the resultant mixture was increased in an air atmosphere at a temperature increase rate of 10° C./minute to 1,500° C. Then, the mixture was heated at 1,500° C. for 12 hours, and allowed to stand to be naturally cooled to room temperature, obtaining a powder sample.

The obtained sample was washed with 10% aqueous ammonia, and then washed with water to produce spinel particles.

(Evaluation)

The measurement of an average particle diameter, measurement of a molybdenum content, measurement of a specific surface area, and measurement of a crystallite diameter were performed by the same methods as in Example 1. As a result, it was found that the average particle diameter was 8 μm, the molybdenum content was 0.3 mol %, the specific surface area was 0.2 m$^2$/g, and the crystallite diameter at the [311] plane was 278 nm.

Comparative Example 1

(Production of Spinel Particles)

A powder sample (spinel particles) was produced by the same method as in Example 1 except that molybdenum trioxide was not added, and that washing using 10% aqueous ammonia and water was not performed.

(Evaluation)

The crystal structure was analyzed by the same method as in Example 1. As a result, the powder sample was found to be a spinel crystal having a composition: $MgAl_2O_4$ but having low crystallinity.

In addition, the surface state was measured by the same method as in Example 1. As a result, molybdenum was not detected from the sample.

Further, the measurement of a specific surface area and measurement of a crystallite diameter were performed by the same methods as in Example 1. As a result, it was found that the specific surface area was 10.1 m$^2$/g and the crystallite diameter was 73 nm.

A SEM image of the obtained spinel particles is shown in FIG. 4. As apparent from the SEM image, the shape of the obtained spinel particles is indefinite.

The formulations for the raw materials in Examples 1 to 7 and Comparative Example 1 are shown in Table 1 below.

TABLE 1

|  | Aluminum compound | | Magnesium compound | | Molybdenum compound | |
| --- | --- | --- | --- | --- | --- | --- |
|  | Type | Amount (g) | Type | Amount (g) | Type | Amount (g) |
| Example 1 | Aluminum hydroxide | 0.52 | Magnesium acetate | 0.48 | Molybdenum trioxide | 0.48 |
| Example 2 | Aluminum oxide | 1.00 | Magnesium oxide | 0.40 | Molybdenum trioxide | 1.42 |
| Example 3 | Aluminum oxide | 1.00 | Magnesium oxide | 0.40 | Molybdenum trioxide | 1.85 |
| Example 4 | Aluminum oxide | 1.00 | Magnesium oxide | 0.40 | Molybdenum trioxide | 2.43 |
| Example 5 | Aluminum oxide | 1.00 | Magnesium oxide | 0.40 | Molybdenum trioxide | 8.57 |

TABLE 1-continued

|  | Aluminum compound | | Magnesium compound | | Molybdenum compound | |
| --- | --- | --- | --- | --- | --- | --- |
|  | Type | Amount (g) | Type | Amount (g) | Type | Amount (g) |
| Example 6 | Aluminum hydroxide | 1.53 | Magnesium oxide | 0.40 | Molybdenum trioxide | 1.42 |
| Example 7 | Aluminum nitrate nonahydrate | 2.48 | Magnesium acetate tetrahydrate | 0.71 | Molybdenum trioxide | 0.48 |
| Comparative Example 1 | Spinel | 1.0 | Spinel | 1.0 | — | — |

The results of the evaluation in Examples 1 to 7 and Comparative Example 1 are shown in Table 2 below.

TABLE 2

|  | Average particle diameter (μm) | Molybdenum content (mol %) | Specific surface area (m$^2$/g) | Crystallite diameter at [311] plane (nm) |
| --- | --- | --- | --- | --- |
| Example 1 | 10 | 0.45 | 0.2 | 353 |
| Example 2 | 12 | 0.30 | 0.1 | 196 |
| Example 3 | 25 | 0.30 | 0.1 | 176 |
| Example 4 | 100 | 0.30 | 0.1 | 330 or more |
| Example 5 | 500 | 0.30 | 0.1 | 330 or more |
| Example 6 | 10 | 0.15 | 0.1 | 273 |
| Example 7 | 8 | 0.30 | 0.1 | 278 |
| Comparative Example 1 | N.D. | 0 | 10.1 | 73 |

* N.D.: No data.

As apparent from Table 2, with respect to the spinel particles in Examples 1 to 7, the crystallite diameter at the plane is extremely large. It is understood that the spinel particles consequently have excellent thermal conductive properties.

The invention claimed is:

1. A plurality of spinel particles, each spinel particle comprising spinel containing a magnesium atom, an aluminum atom, and an oxygen atom, and
molybdenum oxide being disposed on a surface of and/or in an inside of the spinel,
wherein a crystallite diameter of the spinel at a [311] plane is 100 nm or more,
wherein a molybdenum content of the plurality of spinel particles is 5 mol % or less, and
wherein the plurality of spinel particles have an average particle diameter of 0.1 to 1,000 μm.

2. A method for producing the spinel particles according to claim 1, which comprises:
a calcination step for calcining a first mixture containing magnesium molybdate and an aluminum compound; and
a cooling step for cooling the calcined material obtained in the calcination step.

3. The method according to claim 2, which further comprising a precursor preparation step for calcining a second mixture containing a molybdenum compound and a magnesium compound to prepare the magnesium molybdate.

4. The method according to claim 3, wherein a molar ratio of a molybdenum element in the molybdenum compound to a magnesium element in the magnesium compound (molybdenum element/magnesium element) is from 0.01 to 10.

5. A composition comprising the spinel particles according to claim 1 and a resin.

6. The composition according to claim 5, which further comprises a curing agent.

7. The composition according to claim 5, which is a thermally conductive material.

8. A molded article which is obtained by molding the composition according to claim 5.

* * * * *